United States Patent
Cao et al.

(10) Patent No.: US 11,469,015 B2
(45) Date of Patent: Oct. 11, 2022

(54) PROTECTION FROM AND FILTERING OF DISTURBANCES FOR SERIAL CONNECTED FACTS

(71) Applicant: Smart Wires Inc., Union City, CA (US)

(72) Inventors: Liyu Cao, Fremont, CA (US); Haroon Inam, San Jose, CA (US); Amrit Iyer, Oakland, CA (US); Hamed Khalilinia, Hayward, CA (US); Zbigniew Wolanski, Union City, CA (US)

(73) Assignee: Smart Wires Inc., Union City, CA (US)

( * ) Notice: Subject to any disclaimer, the term of this patent is extended or adjusted under 35 U.S.C. 154(b) by 30 days.

(21) Appl. No.: 17/197,627

(22) Filed: Mar. 10, 2021

(65) Prior Publication Data

US 2022/0005633 A1    Jan. 6, 2022

Related U.S. Application Data

(60) Provisional application No. 63/047,154, filed on Jul. 1, 2020.

(51) Int. Cl.
| | | |
|---|---|---|
| *H01C 7/12* | (2006.01) | |
| *H02H 9/00* | (2006.01) | |
| *H03H 7/06* | (2006.01) | |
| *H02H 7/22* | (2006.01) | |
| *H02H 9/04* | (2006.01) | |

(52) U.S. Cl.
CPC ............... *H01C 7/12* (2013.01); *H02H 7/22* (2013.01); *H02H 9/005* (2013.01); *H03H 7/06* (2013.01); *H02H 9/04* (2013.01); *H02H 9/045* (2013.01)

(58) Field of Classification Search
CPC .......... H02H 7/22; H02H 3/00; H02H 1/0007; H02H 9/00; H02H 9/005; H02H 3/087; H02H 9/04; H02H 9/06; H02H 9/045; H02H 9/044; H02H 3/20; H01C 7/12; H03H 7/06
USPC ....................................... 361/3–13
See application file for complete search history.

(56) References Cited

U.S. PATENT DOCUMENTS

| | | | |
|---|---|---|---|
| 3,956,743 A | 5/1976 | Geiszler et al. | |
| 4,123,748 A | 10/1978 | Otani | |
| 4,376,968 A | 3/1983 | Wueschinski et al. | |
| 4,459,629 A * | 7/1984 | Titus | H01H 9/541 361/13 |
| 4,682,369 A | 7/1987 | Schrader | |
| 5,581,256 A | 12/1996 | McEwan | |
| 5,672,137 A | 9/1997 | Adachi et al. | |
| 6,194,881 B1 | 2/2001 | Parker et al. | |
| 6,417,791 B1 | 7/2002 | Benmouyal et al. | |
| 7,031,558 B2 | 4/2006 | Tanbakuchi | |
| 3,508,313 A1 | 8/2013 | Aster | |
| 9,329,070 B2 | 5/2016 | Ruf et al. | |
| 10,507,819 B2 | 12/2019 | Fujiwara et al. | |

(Continued)

*Primary Examiner* — Danny Nguyen
(74) *Attorney, Agent, or Firm* — Womble Bond Dickinson (US) LLP

(57) ABSTRACT

A filter network is insertable into a power transmission line, to handle disturbances in the power transmission line. A first circuit has an RC network in parallel with a surge arrestor, to bypass high frequency disturbances of the power transmission line. A second circuit has inductors for carrying low-frequency power to and from impedance injection units.

20 Claims, 3 Drawing Sheets

(56) References Cited

U.S. PATENT DOCUMENTS

| | | | |
|---|---|---|---|
| 11,070,045 B1* | 7/2021 | Li | H02H 3/207 |
| 2005/0058385 A1 | 3/2005 | Tanbakuchi | |
| 2012/0022672 A1 | 1/2012 | Ruf et al. | |
| 2019/0299967 A1 | 10/2019 | Fujiwara et al. | |

* cited by examiner

PROTECTION FROM AND FILTERING OF DISTURBANCES FOR SERIAL CONNECTED FACTS

This application claims benefit of priority from U.S. Provisional Application No. 63/047,154 titled Protection from and Filtering of Disturbances for Serial Connected FACTS, filed Jul. 1, 2020, which is hereby incorporated by reference.

TECHNICAL FIELD

Embodiments of the disclosure relate to inductor-resistor-capacitor (LRC) filters used to protect power flow control systems from disturbances traveling on a power transmission line.

BACKGROUND

Various activities and natural events can cause disturbances on power transmission lines. These include lightning strikes, load switching, capacitive bank switching, transformer tap changes, and other utility actions. If a power flow control system operating on the transmission line is not protected, its performance may be detrimentally affected, or it may be damaged by such disturbances. There is a need in the art for protective circuits to shunt the energy associated with such a disturbance around operating circuitry of the power flow control system.

SUMMARY

Various circuits and a related method are described herein for handling disturbances on power transmission lines. The circuits and method provide protection from and filtering of disturbances, for serial connected FACTS (Flexible Alternating Current Transmission System) devices.

One embodiment is a filter network, with a first terminal and a second terminal, that is insertable into a power transmission line. A first circuit is connected across the first terminal and the second terminal. The first circuit includes an RC (resistor and capacitor) network in parallel with a surge arrestor. There are multiple IIUs (impedance injection units). A second circuit includes inductors and is for carrying low-frequency power. The inductors are series-connecting the first and second terminals and the IIUs.

One embodiment is a filter network that is insertable into a power transmission line. A first terminal and a second terminal are series connectable into the power transmission line. A first circuit includes a series RC (resistor and capacitor) network in parallel with a surge arrestor. A first end of the first circuit is connected to the first terminal. An opposed second end of the first circuit is connected to the second terminal. The first circuit is to bypass high-frequency disturbances of the power transmission line in connection with the first terminal and the second terminal. A second circuit includes series connected IIUs (impedance injection units) that are series connected with inductors. A first end of the second circuit is connected to the first terminal. An opposed second end of the second circuit is connected to the second terminal. The second circuit is to carry low-frequency power for the transmission line in connection with the first terminal and the second terminal to and from the IIUs.

One embodiment is a method of handling disturbances in a power transmission line. The method includes series connecting a first terminal and a second terminal into the power transmission line. The method includes bypassing high-frequency disturbances of the power transmission line through a first circuit that is connected across the first terminal and the second terminal. The first circuit includes a series RC (resistor and capacitor) network in parallel with a surge arrestor. The method includes carrying low-frequency power for the transmission line through the first and second terminals, through series connected inductors, to and from series connected IIUs (impedance injection units).

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
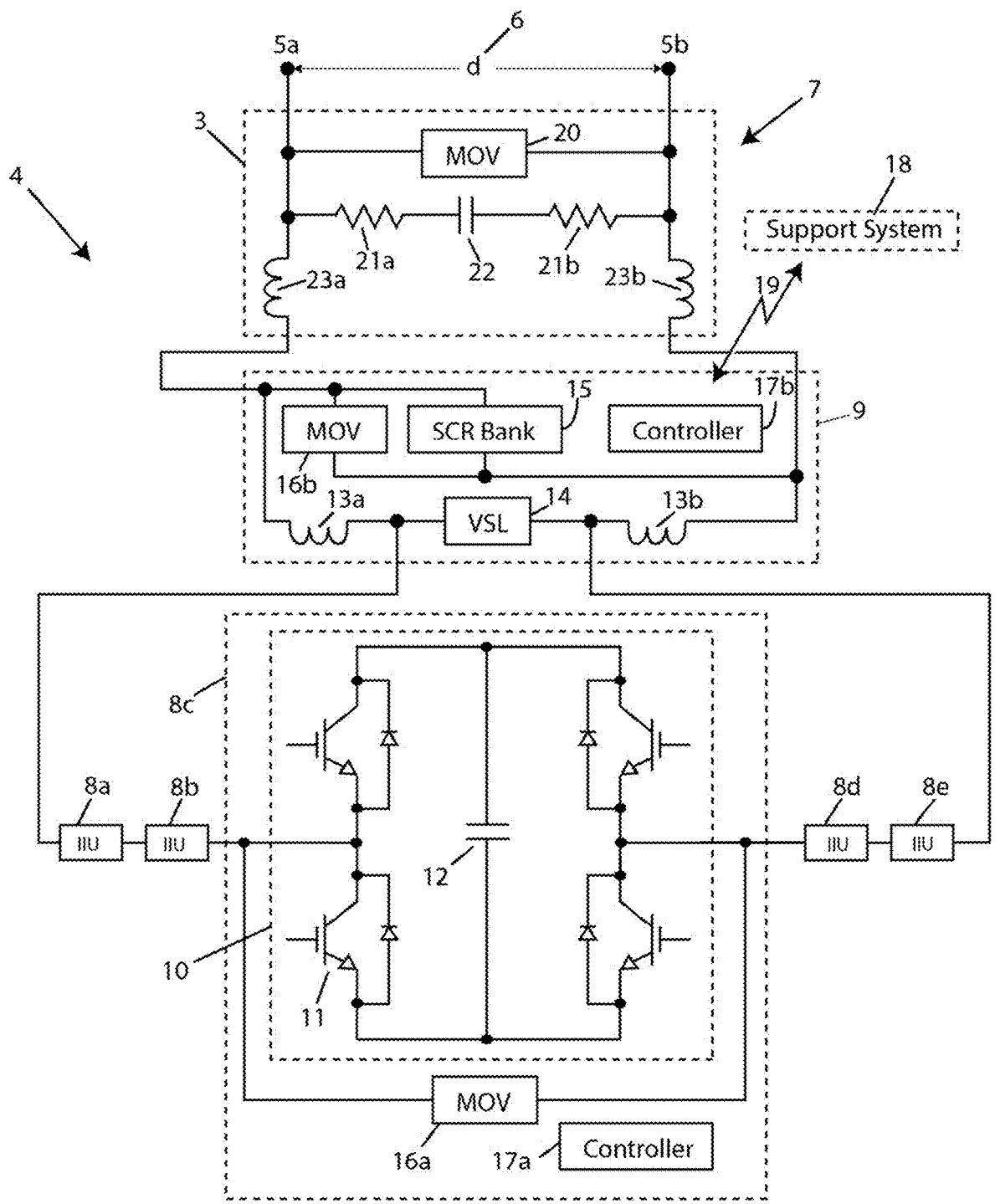
FIG. 1 is a schematic drawing of a filter network connected with a bypass unit and a group of impedance injection modules connected in series according to one embodiment.

A filter network is inserted into a power transmission line for protecting electronic equipment from high frequency disturbances on the line. A first path of the filter network causes high frequency signals to bypass the associated electronic equipment and avoid damage thereto. A second path of the filter network passes low frequency power, up to 1 kHz in some embodiments, in a Flexible Alternating Current Transmission System (FACTS). Different filters may be configured for different transmission line profiles. Surge arrestors may include Metal Oxide Varistors (MOVs) and gapped and non-gapped arrestors. Using a communication link that communicates with a processor associated with the filter network an external support system may be used to determine the status of the filter network.

In a first aspect of the present disclosure a filter network is described, for insertion into a power transmission line to bypass electrical disturbances that may be traveling in the power transmission line. A high-frequency path is provided for bypassing high-frequency disturbances. A low-frequency path is provided for carrying power up to a frequency of 1 kHz. The high-frequency path includes an RC network in parallel with a surge arrestor. The low frequency path comprises inductors and may be an inductive path rather than capacitive or resistive. The filter network may be contained in a Faraday Cage enclosure. The surge arrestor may be gapped or un-gapped and may include a metal oxide varistor (MOV) or a gas discharge tube or any other type of arrestor. An inductor in the low-frequency path may be a choke having a nano-crystalline core. The input/output terminals of the filter network may be spaced apart with a spacing small enough to provide low input inductance, but large enough to limit arcing and creepage between the terminals. The spacing may be predetermined to minimize a particular type of disturbance on the power transmission line. The disturbance may be associated with a particular type of grid event. The spacing may be less than two meters. The filter network may be equipped with a communication link to an external support system. The communication link may be an RF link. The communication link may be used to communicate with a processor in the filter network to determine the status of the filter network. The filter network may be configured to bypass a high-frequency traveling wave passing through the power transmission line. The high-frequency traveling wave may be associated with a lightning strike, switching of a capacitance bank, or load switching on the power transmission line. The filter network may be configured for insertion into a serial-connected Flexible Alternating Current Transmission System (FACTS).

A second aspect of the present disclosure describes a method for bypassing electromagnetic disturbances traveling on a power transmission line using a filter. The method includes providing a low-pass path for passing power at frequencies up to 1 kHz and a high-pass path for bypassing high frequency disturbances. The filter may include an R, L, C network and a surge arrestor and an enclosure having the properties of a Faraday Cage. The method may include provision of a communication link for determining the status of the filter network. A processor may be provided to reside with the filter network and may perform executable instructions in a memory for communicating with an external support system. The filter network characteristics may be configured by appropriate selection of components in the R, L, C network to bypass a traveling wave threat that may be imposed by a lightning strike in a vicinity of the power transmission line, by load changes or by remote switching of a capacitance bank into the power transmission line.

According to some embodiments, a filter network is inserted into a power transmission line for protecting electronic equipment from high frequency disturbances on the line. A first path of the filter network causes high frequency signals to bypass the associated electronic equipment and avoid damage thereto. A second path of the filter network passes low frequency power, up to 1 kHz, in a Flexible Alternating Current Transmission System (FACTS). Different filters may be configured for different transmission line profiles. Surge arrestors may include Metal Oxide Varistors (MOVs) and gapped and non-gapped arrestors. Using a communication link that communicates with a processor associated with the filter network an external support system may be used to determine the status of the filter network.

FIG. 1 illustrates a power flow control system 4 that is series connected into a power transmission line at terminals 5a and 5b, having a spacing 6 between them. Power flow control system 4 may be described as a Flexible Alternating Current Transmission System (FACTS). A power transmission line may comprise a high-voltage transmission line (e.g. 230 kV), a medium-voltage transmission line (e.g. 13.8 kV) or a distribution line (e.g. 480 V). It may reside inside or outside of a switching station. Power flow control system 4 includes a filter network 7 of the present disclosure, a plurality of impedance injection units 8a-8e connected in series, and a bypass unit 9. Filter network 7 is contained within an enclosure 3. Impedance injection unit 8c includes a switching assembly 10 comprising high-power switching devices 11, configured to inject reactive power into the power transmission line by charging and discharging a DC capacitor 12. Impedance injection unit 8c also includes a metal oxide varistor (MOV) 16a and a controller 17a.

In one embodiment, each impedance injection unit 8a, 8b, 8c, 8d, 8e has high-power switching devices 11 connected as an H bridge. Each of the high-power switching devices 11 has a bypass diode, as depicted in FIG. 1. The capacitor 12 is connected as a load at the crossbar of the H bridge. An MOV 16A or other surge arrestor is connected in parallel with the H bridge. The H bridge, with appropriate switching devices 11 activated and others deactivated, can connect the capacitor 12 in either of two opposed polarities to receive voltage and current from the transmission line and charge capacitor 12. Then, with appropriate switching devices 11 activated and others deactivated, the H bridge can connect the capacitor 12 in either of the two opposed polarities to inject the power from the charged capacitor 12 to the transmission line. In the embodiment shown in FIG. 1, these actions and states of the switching devices 11 and the H bridge are controlled by the controller 17a in the IIU.

Bypass unit 9, in one embodiment, includes differential mode chokes (DMCs) 13a, 13b, a vacuum switch link (VSL) 14, a bank of silicon-controlled rectifiers (SCRs) 15 and a MOV 16b connected through DMCs 13a and 13b to the plurality of impedance injection units 8a-8e, and a bypass controller 17b. Bypass controller 17b is in communication with an external support system 18 via a communication link 19. Communication link 19 may be employed to have the bypass controller 17b interrogate the status of filter network 7, including a check of its I/V characteristic, in response to a command from support system 18. Bypass controller 17b controls the VSL 14, directing the VSL 14 to open a switch for active use of the IIUs in power injection into the power transmission line, and close the switch to short across the series connected IIUs and deactivate the IIUs from active use. Communication link 19 may be implemented as an RF link or as a fiber optic link as examples.

Filter network 7 may be configured to bypass or minimize traveling wave disturbances, traveling on the associated power transmission line, where the primary frequency of the traveling wave disturbance is more than 10 kHz for example, while passing power at a frequency less than 1 kHz for example.

Filter network 7 includes a metal oxide varistor (MOV) 20 connected across terminals 5a and 5b. MOV 20 has a non-linear characteristic that reacts very quickly to an overvoltage spike, such as may be caused by a lightning strike. At low frequencies, a leakage current of microamperes or nanoamperes will flow. When stressed by a voltage spike, the device may bypass kiloamperes at low impedance. In one embodiment, a specification for MOV 20 includes, as examples, a varistor voltage of 17 kV, a maximum clamping voltage of 25 kV (@100 A), a maximum peak current of 5000 A, a maximum AC voltage of 7 kV, and a maximum energy dissipation of 2600 J.

In some embodiments, MOV 20 may be replaced by any type of surge arrestor. It may be gapped or gapless. A gapped arrestor will have a sharper I/V response curve. One version of a gapped arrestor is a gas discharge tube, typically used in lower power installations. Gapless arrestors typically comprise a metal oxide disk, such as described for MOV 20. Surge arrestors may be used that are described as snubbers or clamps.

Filter network 7 may further include a capacitor 22 to provide a low-impedance path for high-frequency electrical disturbances. Capacitor 22 may have a capacitance in the range of 0.1-50 µF for example. This path may enable resonant currents that could damage neighboring components. As shown, resistors 21a and 21b are provided to dissipate such resonant currents. Resistors 21a and 21b can be low-inductance resistors and may have a resistance range of 0.05-10Ω for example. Inductors 23a and 23b are provided to provide a high impedance to high frequency electrical disturbances, thereby causing a surge current to flow through MOV 20 or the series path of resistor 21a, capacitor 22 and resistor 21b. Inductors 23a and 23b may have a value of 0.1-100 µH for example. This characteristic of filter network 7 may be referred to as a bypass characteristic, for bypassing electrical disturbances. Inductors 23a and 23b may be differential mode chokes having an air core for example. If space for mounting filter network 7 is limited, inductors 23a and 23b may be configured with a nanocrystalline core. One such core is manufactured by HITACHI METALS, LTD., with a tradename FINEMET. Other possible core materials include powdered cores or M6 steel.

The spacing 6 of terminals between terminals 5a and 5b is to be carefully considered. For low inductance of the high-frequency bypass path the spacing should be as small as possible. However, if the terminals are too close together, failure may occur due to creepage or electrical discharge at a transient voltage peak. Creepage occurs due to surface conduction, which may be increased by the presence of dirt or dust or pollution or grime. Initial leakage currents may increase over time with dirt build-up, leading to carbonization and bridging between terminals 5a and 5b. Spacing 6 may be predetermined and configured for minimizing a disturbance that corresponds to a problematic type of grid event. Spacing 6 may be less than 2 meters to cover many types of grid events or disturbances. Problematic grid events may include lighting strikes, current surges due to switching of capacitor banks, tap changes on transformers, load switching, and any other disturbance that causes a current spike on the power transmission line. These problematic grid events may be characterized by waveforms and frequencies that can be used to configure appropriate filter network configurations for bypassing them. If disturbances are effectively bypassed or minimized, thereby not requiring a utility operator or an automated safety apparatus to open a circuit breaker in the power transmission line, the operational availability of the associated power flow control system 4 is increased, to the benefit of both power utilities and consumers.

In some embodiments, filter network 7 is contained within an enclosure 3. Enclosure 3 may have the properties of a Faraday Cage for attenuating any disturbances such as incident waveforms from a cell tower. Waves associated with such disturbances could otherwise impinge on the enclosure and induce undesirable electromagnetic effects. The Faraday Cage of enclosure 3 comprises a conductive material such as aluminum, where any gaps in the enclosure are small enough to block the highest frequency impinging signal, and the thickness of the enclosure is thick enough to block the lowest frequency impinging signal.

Figure 2:
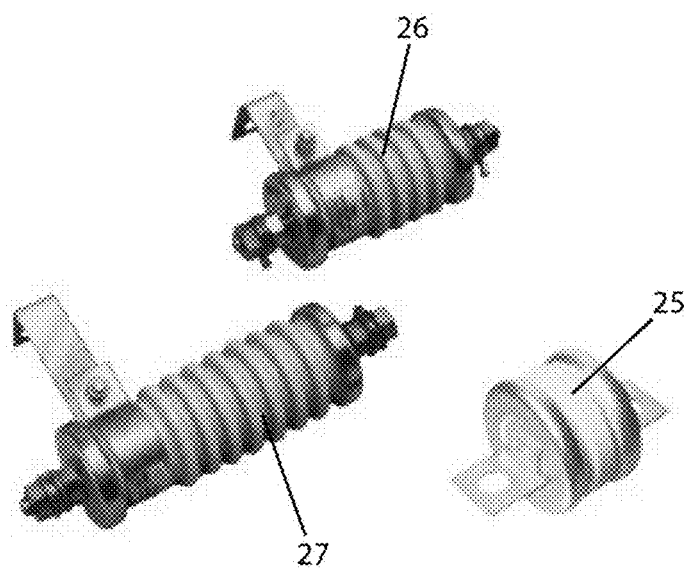
FIG. 2 is a perspective view of several variations of a metal oxide varistor (MOV).

FIG. 2 is a perspective view of several variations of a metal oxide varistor (MOV). In FIG. 2, a range of transient/surge absorbers, which may be those manufactured by PANASONIC, is shown. A single-disk arrestor 25 is shown, together with a three-disk arrestor stack 26 and a six-disk arrestor stack 27. Each disk shown is a sintered zinc-oxide disk. Bigger stacks correspond with higher maximum voltages.

Figure 3:
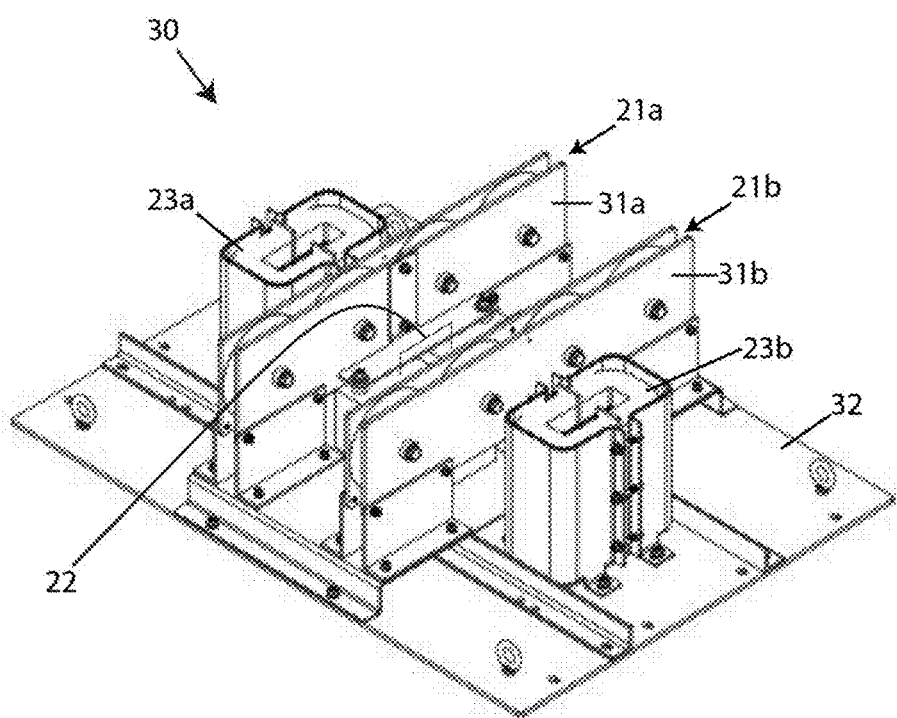
FIG. 3 is a perspective view of an R, L, C filter network according to one embodiment.

FIG. 3 is a perspective view of an R, L, C filter network according to one embodiment. Referring to FIG. 3, an R, L, C network 30 may include resistors 21a, 21b, capacitor 22 and inductors 23a, 23b of FIG. 1. Capacitor 22 can be implemented using a pair of capacitors as shown, with each having a high impulse current rating and low series inductance. When the associated impedance injection units 8a-8e are not operational and VSL 14 is closed, the minimized input inductance of R, L, C, network 30, appearing across terminals 5a and 5b of FIG. 1, may be in the range 0.1-200 µH for example. Resistors 21a and 21b are low inductance resistors, and they are contained within resistor frames 31a, 31b. Each of inductors 23a and 23b may include a nanocrystalline core for high inductance in a small physical size. The R, L, C components are assembled onto an R, L, C assembly plate 32. The MOV component, labeled MOV 20 in FIG. 1, is mounted separately. The filter network 7, including separate mountings of R, L, C assembly plate 32 and the MOV 20 component, is configured with fasteners for physical attachment to a bypass unit 9 combined with a plurality of series connected impedance injection units such as 8c, to implement the electrical configuration shown in FIG. 1.

The teachings contained in the embodiments described herein may be applied to many variations of power flow control system 4, including different configurations of bypass unit 9, and different series combinations of impedance injection units such as 8c.

What is claimed is:

1. A filter network insertable into a power transmission line, comprising:
   a first terminal and a second terminal that are insertable into the power transmission line;
   a first circuit, comprising an RC (resistor and capacitor) network in parallel with a surge arrestor, for bypassing high frequency disturbances, connected across the first terminal and the second terminal;
   a plurality of IIUs (impedance injection units); and
   a second circuit, comprising a plurality of inductors, for carrying low frequency power, series-connecting the first and second terminals and the plurality of IIUs.

2. The filter network of claim 1, wherein the plurality of IIUs are in series connection with each other.

3. The filter network of claim 1, further comprising:
   a further surge arrestor in parallel with an SCR (silicon-controlled rectifier) bank, connected in series with a subset of the plurality of inductors, across the first terminal and the second terminal in parallel with the first circuit.

4. The filter network of claim 1, wherein the surge arrestor comprises an MOV (metal oxide varistor), a gapped arrestor, or a non-gapped arrestor.

5. The filter network of claim 1, further comprising at least one controller.

6. The filter network of claim 1, wherein each of the plurality of IIUs comprises a plurality of switches, a capacitor, and a further surge arrestor.

7. The filter network of claim 1, further comprising a switch in parallel with the plurality of IIUs.

8. The filter network of claim 1, wherein the plurality of inductors in the second circuit comprises a plurality of DMCs (differential mode chokes).

9. The filter network of claim 1, further comprising:
   a Faraday cage enclosing at least the RC network in parallel with the surge arrestor.

10. A filter network insertable into a power transmission line, comprising:
    a first terminal and a second terminal that are series connectable into the power transmission line;
    a first circuit, comprising a series RC (resistor and capacitor) network in parallel with a surge arrestor, a first end of the first circuit connected to the first terminal and an opposed second end of the first circuit connected to the second terminal, to bypass high frequency disturbances of the power transmission line in connection with the first terminal and the second terminal; and
    a second circuit, comprising a series connected plurality of IIUs (impedance injection units) series connected with a plurality of inductors, a first end of the second circuit connected to the first terminal, an opposed second end of the second circuit connected to the second terminal, to carry low frequency power for the power transmission line in connection with the first terminal and the second terminal to and from the plurality of IIUs.

11. The filter network of claim 10, further comprising:
a third circuit comprising a further surge arrestor in parallel with an SCR (silicon-controlled rectifier) bank, series connected with a subset of the plurality of inductors across the first terminal and the second terminal in parallel with each of the series RC network and the surge arrestor.

12. The filter network of claim 10, wherein the surge arrestor comprises one or more from a set consisting of an MOV (metal oxide varistor), a gapped arrestor, and a non-gapped arrestor.

13. The filter network of claim 10, further comprising:
at least one controller to check a current or voltage characteristic of the first circuit and control a switch to activate and deactivate the plurality of IIUs; and
each of the plurality of IIUs having at least one further controller to control switches in the IIU.

14. The filter network of claim 10, wherein each of the plurality of IIUs comprises:
a plurality of switches connected as an H bridge;
a capacitor, connected as a load at a crossbar of the H bridge; and
a further surge arrestor in parallel with the H bridge.

15. The filter network of claim 10, further comprising a VSL (vacuum switch link) in parallel with the series connected plurality of IIUs.

16. The filter network of claim 10, wherein the plurality of inductors in the second circuit comprises:
a first inductor and a first DMC (differential mode chokes), series-connecting the first terminal and a first end of the series connected plurality of IIUs; and
a second inductor and a second DMC, series-connecting the second terminal and an opposed second end of the series connected plurality of IIUs.

17. The filter network of claim 10, further comprising:
a Faraday cage enclosing at least the series RC network and the surge arrestor.

18. A method of handling disturbances in a power transmission line, comprising:
series connecting a first terminal and a second terminal into the power transmission line;
bypassing high frequency disturbances of the power transmission line through a first circuit connected across the first terminal and the second terminal, the first circuit comprising a series RC (resistor and capacitor) network in parallel with a surge arrestor; and
carrying low-frequency power for the power transmission line through the first and second terminals, through a plurality of series connected inductors, to and from a plurality of series connected IIUs (impedance injection units).

19. The method of claim 18, further comprising:
further bypassing at least a portion of the high frequency disturbances of the power transmission line through a subset of the plurality of series connected inductors and through a further surge arrestor and an SCR (silicone-controlled rectifier) bank in parallel with the further surge arrestor.

20. The method of claim 18, further comprising:
operating, through one or more controllers, a plurality of switches to activate and deactivate the plurality of series connected IIUs and for the carrying the low-frequency power to and from one or more capacitors in the plurality of series connected IIUs.

* * * * *